ENCODER

Filed June 8, 1964

3 Sheets-Sheet 1

INVENTOR.
Larkin B. Scott

BY Andrew L. Ney

ATTORNEY.

Dec. 19, 1967 L. B. SCOTT 3,359,553

ENCODER

Filed June 8, 1964 3 Sheets-Sheet 2

INVENTOR.
Larkin B. Scott
BY
Andrew L. Ney
ATTORNEY.

INVENTOR.
Larkin B. Scott
BY
Andrew L. Ney
ATTORNEY.

United States Patent Office 3,359,553

Patented Dec. 19, 1967

3,359,553

ENCODER

Larkin B. Scott, Fort Worth, Tex., assignor to The Perkin-Elmer Corporation, Norwalk, Conn., a corporation of New York Filed June 8, 1964, Ser. No. 373,323
5 Claims. (Cl. 340—347)

ABSTRACT OF THE DISCLOSURE

A shaft driven analog to digital encoder which is adapted to provide a multi-digit decimal output indication includes commutator segments formed on a surface of a single clad printed circuit board. The circuit board comprises a first plurality of groups of conductive members from which signals are generated corresponding to the least significant digit and a second plurality of conductive members from which signals are generated which correspond to the next higher significant digit. Switching means are provided for sequentially applying electrical energy to the conductive members of the second group and for sequentially connecting that member in the second plurality to which energy is at any time coupled to members of one of said first plurality of groups.

*General*

The present invention relates to encoders in general and particularly to a decimal shaft encoder capable of providing angular position data directly in decimal format.

A shaft encoder is a device which when coupled to a rotating shaft is capable of providing shaft position data. The data is commonly provided in either binary or decimal form. A decimal encoder bypasses the need to use binary codes and generates directly for each decade a signal on one of ten wires which directly drives a display requiring this type of an input. When compared with encoders which provide data in binary form, the decimal encoder saves the expense and complexity of converting from binary to decimal. On the other hand, if a binary coded decimal representation of an output is actually required, the conversion from decimal to a four bit binary code is extremely simple and requires only a few additional components.

One of the more important components of an encoder is the commutator or code pattern carrying member. As the shaft being monitored rotates, electrical signals are developed as a wiper arrangement, rotating with the shaft, makes contact with the different conductive sections of the commutator. At the present time, various encoders are commercially available which utilize the multilayer printed circuit technique in the fabrication of the commutator. It has been found that this type of construction is a major portion of the manufacturing cost of the encoder.

One of the advantages of the present invention is that the underlying principles make possible the construction of commutators or code patterns by the application of conventional single layer printed circuit techniques. The result is an encoder which is considerably less expensive and considerably simpler to fabricate than encoders which are presently commercially available.

It is an object of the present invention to provide a new and improved encoder.

It is another object of the present invention to provide a new and improved decimal shaft encoder.

It is a further object of the present invention to provide a new and improved decimal shaft encoder which is simple in construction and inexpensive to fabricate.

It is still another object of the present invention to provide a new and improved decimal shaft encoder having a commutator which may be constructed through the application of conventional printed circuit techniques.

An encoder constructed in accordance with the present invention comprises a first plurality of conductive members from which signals are generated which correspond to the least significant digit of numbers which may be read out and a second plurality of conductive members from which signals are generated which correspond to the next higher significant digit of numbers which may be read out. Each member in the second plurality is associated with specific members in the first plurality. The encoder according to the present invention further includes means for supplying electrical energy and means for sequentially coupling the electrical energy to the conductive members in the second plurality and for sequentially connecting that member in the second plurality to which the energy is at any time coupled to its associated members in the first plurality.

For a better understanding of the present invention, together with other and further objects thereof, reference is had to the following description, taken in connection with the accompanying drawings, and its scope will be pointed out in the appended claims.

Referring to the drawings.

*Description of the encoder*

Figure 1:
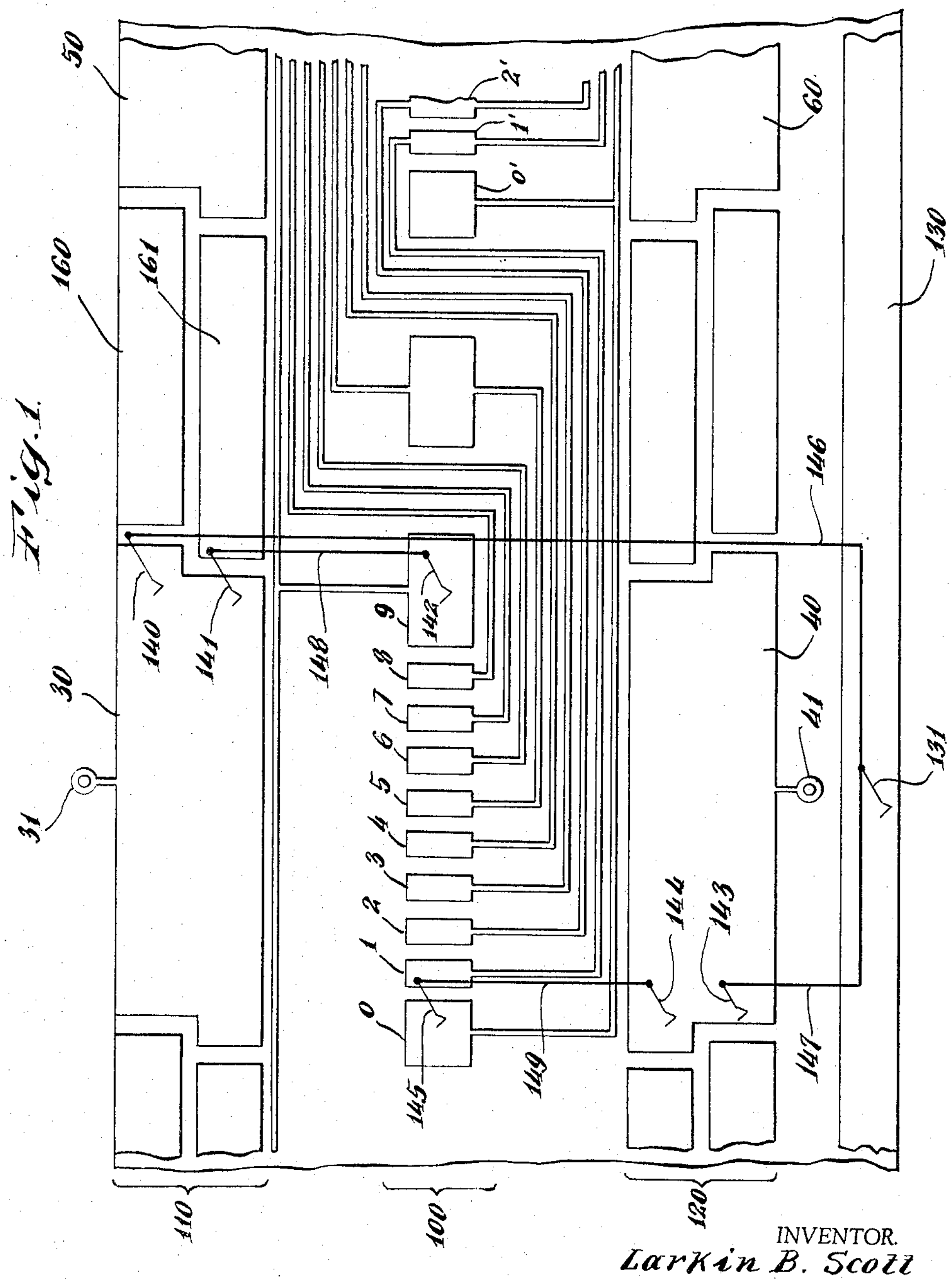
FIGURE 1 shows a portion of a commutator for a decimal encoder constructed in accordance with the present invention.

Referring to FIGURE 1, a commutator for a decimal encoder constructed in accordance with the present invention includes a first plurality of conductive members from which signals are generated which correspond to the least significant digit of numbers which may be read out. For the decimal system, these signals correspond to the units digit decade. These conductors may be disposed in a track 100 and for a decimal encoder may be arranged in five groups of ten conductors each. Only one complete group and a portion of another are shown in FIGURE 1.

The conductive members in the complete group in track 100 have been given reference numerals 0–9, inclusive, which correspond to the units digits represented by the signals generated from these particular conductors. The conductive members in the group which is partially shown have been numbered likewise except that these reference numerals are followed by prime symbols. The conductive members in the five groups in track 100 corresponding to the same units digits are electrically interconnected. A single output for each of the units digit conductors is developed at ten output terminals which are not shown.

The commutator shown in FIGURE 1 further includes a second plurality of conductive members from which signals are generated which correspond to the next higher significant digit of numbers which may be read out. For a decimal number, these signals correspond to the tens digit decade. This second plurality of conductive members may be disposed in two tracks, 110 and 120, and for a decimal encoder each track may be composed of five conductive members. Track 110, for which the drawing only shows two conductive members 30 and 50, generates signals which correspond to the odd tens digit of numbers which may be read out while track 120, for which only two conductive members 40 and 60 are shown, generates signals which correspond to the even tens digit of numbers which may be read out.

Each of the conductive members in tracks 110 and 120 is associated with specific conductive members in track 100 and more particularly with a specific group of conductive members in track 100. For example, conductive member 30 on track 110 and conductive member 40 on track 120 are associated with the group 0–9 inclusive, in track 100. Conductive member 50 on track 110 and conductive member 60 on track 120 are associated with the group 0′, 1′, 2′. For a complete commutator, one conductive member from track 110, the odd tens digit track, and one conductive member from track 120, the even tens digit track, are associated with each group of conductive members on track 100.

Each of the conductive members on tracks 110 and 120 has a separate output terminal. A terminal 31 serves to supply an output signal developed from conductive member 30, while a terminal 41 serves to supply an output signal developed from conductive member 40. Thus, there is a total of ten output terminals for the conductive members of tracks 110 and 120 which when added to the ten output terminals from track 100 makes a total of twenty output terminals for the entire encoder.

As previously mentioned, the principles underlying the present invention make possible the fabrication of the commutator by the application of conventional printed circuit techniques. Although no such limitation on construction is intended, it will be assumed for the remainder of this specification that the commutator employed is an encoder constructed in accordance with the present invention has been fabricated by the application of printed circuit techniques.

Figure 2:
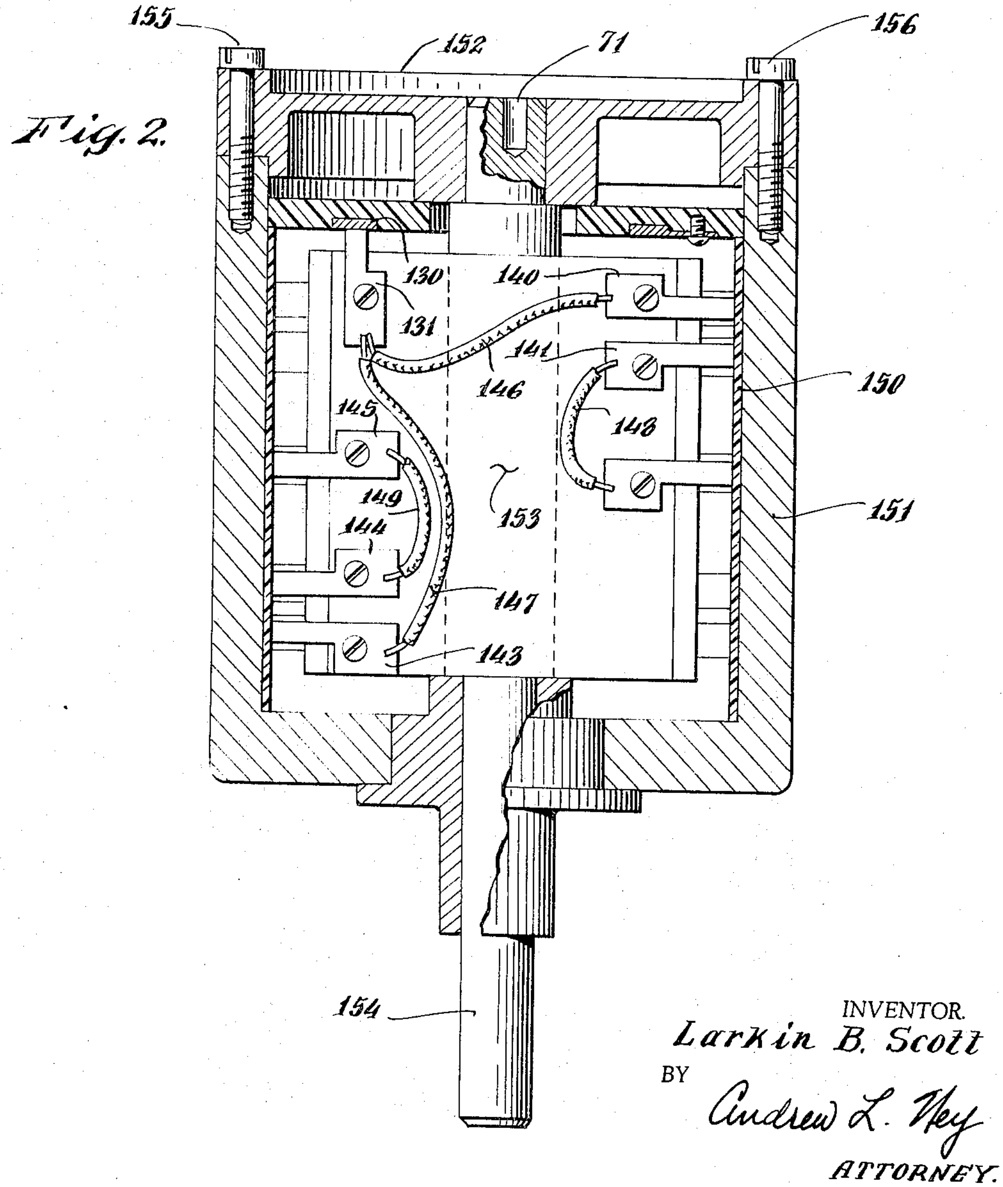
FIGURE 2 shows a decimal shaft encoder constructed in accordance with the present invention.

Referring to FIGURE 2, which is a cross-sectional view of an encoder constructed in accordance with the present invention, there is shown a resilient backing or support 150 for the conductive sections in tracks 100, 110, and 120 of the FIGURE 1 commutator. Backing 150 may be the usual phenolic material used for printed circuit boards. The commutator, made originally on a flat printed circuit board, is installed in the encoder so that it assumes a cylindrical shape.

The encoder of the invention further includes means for supplying electrical energy. This means may include an electrical energy source (not shown), a slip ring 130 connected to this source and a slip ring wiper 131.

The encoder constructed in accordance with the present invention additionally includes means for sequentially coupling the electrical energy to the conductive members in the second plurality and for sequentially connecting that member in the second plurality to which the energy is at any time coupled to its associated members in the first plurality. This function may be performed by a first wiper group composed of wipers 140, 141 and 142 and a second wiper group composed of wipers 143, 144 and 145. Each of the wiper groups has one wiper connected to the slip ring wiper 131. In particular, wipers 140 and 143 are connected to slip ring wiper 131 by leads 146 and 147 respectively. The remaining two wipers in each of the wiper groups are connected to each other. Wiper 141 is connected to wiper 142 by lead 148, while wiper 144 is connected to wiper 145 by lead 149.

Referring again to FIGURE 1, wipers 140 and 141 are seen to be aligned so as to make contact with the conductive sections in track 110 while wipers 143 and 144 are aligned to make contact with the conductive sections in track 120. Wipers 142 and 145 are aligned to contact the conductive sections in track 100. Wipers 142 and 145 are further aligned, with respect to wipers 140, 141, and 144, 145, respectively to contact the ten conductive sections in track 100 associated with the conductive section in tracks 110 and 120 with which wipers 140, 141 or 143, 144 are at any time in contact. For the FIGURE 1 commutator, wiper 142 is in contact with the units digit group 0–9, inclusive during the period that wipers 140 and 141 are in contact with conductive section 30 in tract 110. Similarly wiper 145 is in contact with the units digit group 0–9, inclusive, during the period that wipers 143 and 144 are in contact with conductive section 40 in track 120.

Referring again to FIGURE 2, the slip ring wiper 131 and wipers 140–145 are mounted on a moving member 153 made of a suitable insulating material. A shaft 154 rotates moving member 153 in such a way that the wipers 140–145 sequentially make contact with the respective conductive sections in the tracks 100, 110 and 120. The commutator and moving member may be enclosed within a housing 151 having an end plate 152 which is secured to the housing by any suitable means such as screws 155 and 156.

*Operation of the encoder*

Referring to both FIGURES 1 and 2, as the input shaft 154 rotates the moving member 153, electrical energy is sequentially coupled to the conductive members in tracks 110 and 120 through the slip ring 130, the slip ring wiper 131 and wipers 140 and 143 which are directly connected to slip ring wiper 131. If it be imagined that in FIGURE 1 the wipers have been moving from left to right, then it can be seen that the wiper group in contact with track 120 has just made contact with conductive section 40 creating an even tens digit output at terminal 41. At the same instant an output is created at the "0" units digit output since the electrical energy coupled from slip ring 130 to conductive section 40 is in turn coupled to conductive section 0 by way of wipers 144 and 145 and lead 149.

While the foregoing is occurring, the wiper group which contacts track 110 also causes the development of an output signal at terminal 31 of conductive section 30 and at the "9" units digit output terminal, but because of buffer circuitry which will be described hereinafter, precedence is given to the outputs at terminal 41 and the "0" units digit output terminal.

As things proceed with the wipers continuing to move to the right, conductive section 40 is sequentially connected to the units digit sections 1–9, inclusive, in track 100. This in turn causes a sequential development of output signals at the units digit output terminals. While wiper 145 sequentially contacts the units digit sections in track 100, wiper 142 passes over the inter-connections between the corresponding units digit sections of adjacent units digit groups. However, wiper 142 is not energized during this period since wipers 140 and 142 are in contact with a pair of conductive sections 160 and 161 respectively which are seen separated or insulated from each other. It should be mentioned that in the fabrication of the commutator, the space between consecutive conductive sections 30 and 50 in track 110 and conductive sections 40 and 60 in track 120 may be entirely bare rather than as shown with conductive sections 160 and 161 separated.

After a tenth of a revolution from the condition shown in FIGURE 1, wipers 140 and 141 make contact with a new odd tens digit section 50 in track 110, which will have precedence over the even tens digit section 40 with which wipers 143 and 144 are still in contact. Now, the group of units digit sections 0′, 1′, 2′ . . . in track 100 associated with the next odd tens digit section 50 in track 110 sequentially receive the electrical energy from slip ring 130. Thus, every tens digit change is brought about by the first and second wiper groups switching alternately and since there is also a switch in the excitation to wipers 142 and 145 there is synchronism between the units and tens digit changes.

While the wiper groups in FIGURE 1 are shown to be separated by one-tenth of a revolution, any separation equal to an odd number of revolutions divided by ten will work equally well. In fact, as shown in FIGURE 2, the wiper groups are separated by a half revolution.

Because the commutator in FIGURE 1 may be made by the application of conventional printed circuit techniques, the units digit sections are interconnected without crossovers and plating through techniques. To accomplish this, however, it is necessary for wipers 142 and 145 to traverse the interconnections in reverse order in moving from one group of units digit sections to the next. As previously mentioned, during this traversal the wiper 142 or 145 is deprived of excitation. This is necessary to avoid the generation of false output signals. However, there must always be a point where the unexcited wiper 142 or 145 will meet an excited interconnection and because the wipers 142 and 145 will at any time contact two adjacent conductive sections, an adjacent interconnection is also energized, thus creating a false output signal. To avoid this possibility, the interconnection to be so encountered is broadened considerably to insure that the wiper 142 or 145 cannot be bridging that interconnection to another during any part of its excitation interval. The interconnection so treated for the FIGURE 1 commutator is that for the units digit "5."

As indicated above, wipers 142 and 145 are of such size that in switching from one conductive section to another, the wipers make contact with two adjacent sections. In addition, wipers 140, 141, 143, and 144 are so disposed that before the wipers break contact with any of the conductive sections in tracks 110, 120, the other pair of wipers will make contact with their associated conductive sections. Thus, just before and just after switching from one conductive section to the next, two signals are generated for the decade being switched. Such construction is desirable for encoders in that absence of signals from both the units and tens digits outputs should not occur. Because of this construction, switching circuitry, which at the same time provides buffering or current amplification, is needed between the encoder and the readout device so as to give precedence to the proper signals.

Figure 3:
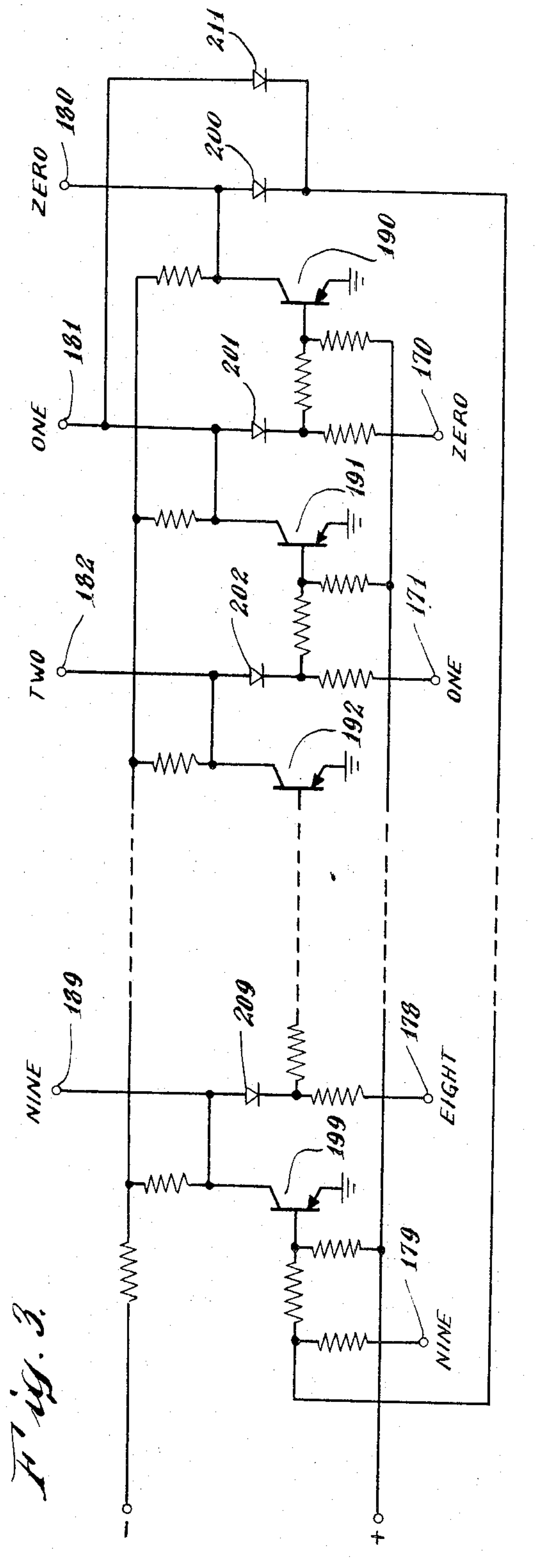
FIGURE 3 shows an electrical circuit which may be used in conjunction with a decimal encoder constructed in accordance with the present invention.

FIGURE 3 shows switching circuit which may be employed to give precedence to the proper signals. The units digit output terminals are represented in FIGURE 3 by terminals 170, 171 . . . 178, 179. The output signals to the readout device are developed at terminals 180, 181, 182 . . . 189. During overlap base current is supplied to two of the transistors of the group of transistors 190, 191, 192 . . . 199. The diode of the group of diodes 200, 201, 202 . . . 209 connected between the collector of the transistor associated with the higher significance output and the base circuit of the transistor associated with the lower significance output becomes conductive and the junction of the diode and the base circuit resistors to which it is connected is held near ground potential. This renders nonconductive the transistor associated with the lower significance output so that it no longer conducts through its collector circuit and thus an output is only developed at the collector of the transistor associated with the higher significance output. A circuit similar to the one shown in FIGURE 3 may be used with the tens digit conductive sections.

In order to insure an overlap of signals during the units digit transition from "9 "to "0," the conductive section 9 for the "9" output is enlarged. Thus, the excitation of the "9" conductive section vanishes at about the point where transition from the "0" conductive section to the "1" conductive section of the next units digit group is taking place. This construction necessitates the need for an additional diode 211 connected between terminal 181 and diode 200. In this way, the "1" conductive section of the following units digit group is given precedence over the "9" conductive section of the preceding units group digit group.

*Description and operation of multi-turn encoder*

Figure 4:
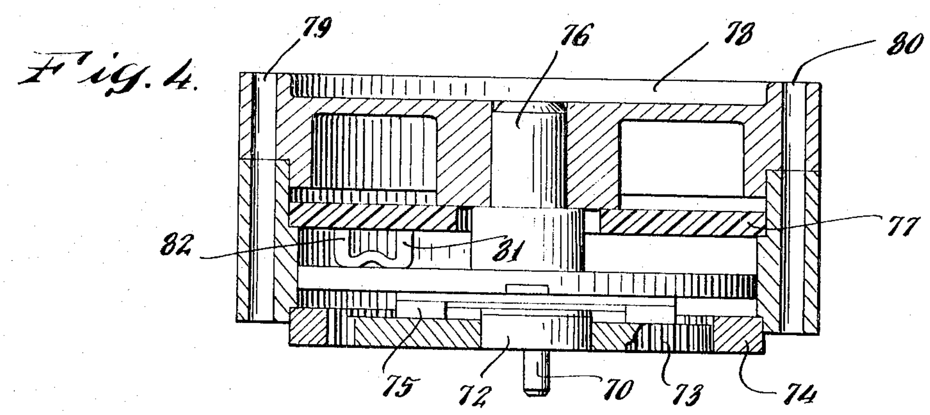
FIGURE 4 shows a multi-turn adapter which extends the range of the FIGURE 2 encoder beyond one revolution.

FIGURE 4 shows a multi-turn adapter which, when coupled to the FIGURE 2 encoder, extends the range of the encoder beyond one revolution. The multi-turn adapter causes the development of signals which correspond to the next higher significance digit of numbers which may be read out from the combined encoder. For a decimal encoder, these signals correspond to the hundreds digit decade. The relative rotational speeds between the basic encoder wiper arrangement of FIGURES 1 and 2 and the wiper arrangement of the multi-turn adapter is such that for each complete revolution of the wipers of the basic encoder, there is one-tenth of a revolution of the wipers of the multi-turn adapter.

Referring to FIGURES 2 and 4, the multi-turn adapter is coupled to the basic encoder by way of an eccentric member 70 which fits into an eccentric hole 71 in the rear end of the shaft 154 in the basic encoder. As the eccentric shaft 70 rotates in response to the turning of shaft 154, an eccentric 72 to which eccentric shaft 70 is fixed also rotates. A planet gear 73 rotates with the rotation of eccentric 72. The planet gear 73 meshes with a stationary internal gear 74. By proper choice of gear ratio, a speed reduction of 10:1 may be achieved so that the multi-turn adapter will, in fact, generate signals corresponding to the hundreds digit decade.

An Oldham coupling 75 is effective to convert the off-center rotation of eccentric 72 and planet gear 73 to an on-center rotation. This conversion to on-center rotation is imparted to a shaft 76 which in turn causes a plurality of wipers 81–84 inclusive (only 81 and 82 are shown in FIGURE 4) to rotate on-center. The wipers 81–84 move along a plurality of tracks on a commutator 77. The particular conductor pattern of commutator 77 will be described hereinafter. An end plate 78 similar to end plate 152 of the basic encoder holds commutator 77 in place. The multi-turn adapter may be fixed to the basic encoder by the insertion of a pair of screws through holes 79 and 80.

Shaft 76 may have an eccentric hole similar to the eccentric hole 71 in shaft 154 of the basic encoder. This permits one multi-turn adapter to pick up the rotation of another so that more than one adapter can be used with the basic encoder. One of the consequences of this feature is that the multi-turn adapters and the encoder can be phased independently.

Figure 5:
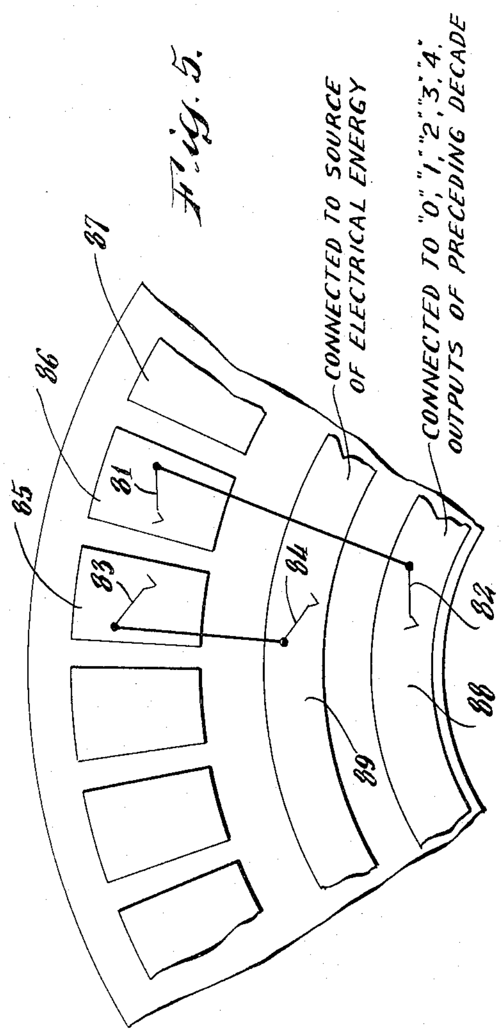
FIGURE 5 shows a portion of a commutator for the FIGURE 4 multi-turn adapter.

FIGURE 5 shows a portion of the code pattern of commutator 77 of the FIGURE 4 multi-turn adapter. Also shown is the wiper arrangement for the multi-turn adapter.

The code pattern of the commutator of FIGURE 5 is composed of three tracks. The first track includes a plurality of conductive sections 85, 86, 87 . . . while the second and third tracks 88 and 89 respectively are continuous, circular conductive sections. Track 88 is connected to the "0," "1," "2," "3," and "4" outputs of the preceding decade through a properly arranged diode circuit which isolates the outputs from each other. Whenever an output signal is developed at any of these outputs, conductive section 88 is energized. Track 89 is directly connected to a source of electrical energy so that conductive section 89 is continuously excited.

The wiper arrangement for the multi-turn adapter is such that wipers 81 and 82 are connected together as are wipers 83 and 84. Wipers 81 and 83 are aligned to contact that track of commutator 77 composed of conductive sections 85, 86, 87 . . . while wipers 82 and 84 are aligned to contact tracks 88 and 89 respectively.

The arrangement shown in FIGURE 5 contemplates clockwise movement of the wiper arrangement for an increasing count. For the particular arrangement shown in FIGURE 5, the wipers are in the approximate position that would exist when a transition from "9" to "0" is taking place in the stage of the next lower significance. When this transition takes place, conductor 88 is excited which in turn causes excitation of conductive section 86. Because conductive section 89 is in direct contact with the source of electrical energy, conductive section 85 is excited so long as wiper 83 is in contact with this conductive section. Therefore, conductive section 85 is excited both before and after the transition which occurs in the stage of next lower significance. After transition, both conductive sections 85 and 86 are excited so that output signals are developed at the output terminals of these sections. This overlap condition is handled by precedence circuitry similar to the circuitry shown in FIGURE 3.

As the wipers continue to rotate, a point is reached in the next lower significance stage at which time a transition from an output of "4" to "5" occurs. At this point conductive section 88 is no longer excited so that conductive section 86 is no longer excited because of its contact with wiper 81. However, by this time wiper 83 is in contact with conductive section 86 so that conductive section 86 remains excited. This condition persists during the time that the next lower significance stage is traversing outputs corresponding to "5" through "9." It becomes apparent, that the commutator and wiper arrangement shown in FIGURE 5 avoids the necessity of accurate gearing between the encoder of FIGURE 1 and the multi-turn adapter or between adjacent multi-turn adapters.

While there has been described what is at present considered to be a preferred embodiment of this invention, it will be obvious to those skilled in the art that various changes and modifications may be made therein without departing from the invention and it is, therefore, aimed to cover all such changes and modifications as fall within the true spirit and scope of the invention. For example, it will be apparent that principles underlying the present invention may be applied in the development of an encoder capable of providing angular position data in format other than decimal. Furthermore, the decimal encoder of FIGURES 1 and 2 may be modified by changing the number of conductive sections in the various tracks so long as corresponding changes are made in the number and position of the wiper groups.

In addition, while the invention has been described as a shaft encoder, it will be apparent that other encoders such as rectilinear encoders may be developed based upon the principles underlying the invention.

I claim:

1. A decimal encoder comprising:

a first track of conductive sections arranged in five groups of ten sections each from which signals are generated which correspond to the units digit of numbers which may be read out;

a second track of five conductive sections from which signals are generated which correspond to the even tens digit of numbers which may be read out, each conductive section in said second track positioned in fixed spatial relationship with respect to one group of ten sections in said first track;

a third track of five conductive sections from which signals are generated which correspond to the odd tens digit of numbers which may be read out, each conductive section in said third track positioned in fixed spatial relationship with respect to one group of ten sections in said first track;

means for supplying electrical energy;

and means for sequentially coupling said electrical energy alternately to conductive sections in said second and third tracks and for sequentially connecting that section in said second and third tracks to which said energy is at any time coupled to the ten conductive sections of the spatial related group in said first plurality.

2. A decimal encoder according to claim 1 wherein the conductive sections are disposed circumferentially around the inside surface of a cylinder.

3. A decimal encoder comprising:

a first track of conductive sections arranged in five groups of ten sections each from which signals are generated which correspond to the units digit of numbers which may be read out;

a second track of five conductive sections from which signals are generated which correspond to the even tens digit of numbers which may be read out, each conductive section in said second track positioned in fixed spatial relationship with respect to one group of ten sections in said first track;

a third track of five conductive sections from which signals are generated which correspond to the odd tens digit of numbers which may be read out, each conductive section in said third track positioned in fixed spatial relationship with respect to one group of ten sections in said first track;

means for supplying electrical energy;

a first wiper group having a first wiper in continuous contact with said energy supply means and aligned to contact said conductive sections in said second track, a second wiper aligned to contact said conductive sections in said second track, and a third wiper connected to said second wiper and aligned to contact the ten conductive sections in said first track which is spatially positioned with respect to the section in said second track with which said first and second wipers are at any time in contact;

a second wiper group having a fourth wiper in continuous contact with said energy supply means and aligned to contact said conductive sections in said third track, a fifth wiper aligned to contact said conductive sections in said third track, and a sixth wiper connected to said fifth wiper and aligned to contact the ten conductive sections in said first track which is spatially positioned with respect to the section in said third track with which said fourth and fifth wipers are at any time in contact;

and a moving member upon which said wipers are mounted for moving said wipers along said first, second and third tracks.

4. A decimal encoder according to claim 3 wherein the conductive sections are disposed circumferentially around the inside surface of a cylinder.

5. A decimal encoder comprising:

a first track of conductive sections arranged in five groups of ten sections each from which signals are generated which correspond to the units digit of numbers which may be read out;

a second track of five conductive sections from which signals are generated which correspond to the even tens digit of numbers which may be read out, each conductive section in said second track positioned in fixed spatial relationship with respect to one group of ten sections in said first track;

a third track of five conductive sections from which signals are generated which correspond to the odd tens digit of numbers which may be read out, each conductive section in said third track positioned in fixed spatial relationship with respect to one group of ten sections in said first track;

means for translating electrical energy;

a slip ring connected to said energy translating means;

a slip ring wiper in continuous contact with said slip ring;

a first wiper group having a first wiper connected to said slip ring wiper and aligned to contact said conductive sections in said second track, a second wiper aligned to contact said conductive sections in said second track, and a third wiper connected to said second wiper and aligned to contact the ten conductive sections in said first track which is spatially positioned with respect to the section in said second track with which said first and second wipers are at any time in contact;

a second wiper group having a fourth wiper connected to said slip ring wiper and aligned to contact said conductive sections in said third track, a fifth wiper aligned to contact said conductive sections in said third track, and a sixth wiper connected to said fifth wiper and aligned to contact the ten conductive sections in said first track which is spatially positioned with respect to the section in said third track with which said fourth and fifth wipers are at any time in contact;

and a moving member upon which said wipers are mounted and for moving said slip ring wiper along said slip ring, said first and fourth wipers along said first track, said second and third wipers along said second track, and said fifth and sixth wipers along said third track.

References Cited

UNITED STATES PATENTS 3,070,789 12/1962 Kristy ............ 340—347
3,167,758 1/1965 Pullen ............ 340—347

MAYNARD R. WILBUR, *Primary Examiner.*

G. R. EDWARDS, J. H. WALLACE, *Assistant Examiners.*